United States Patent [19]
Ishikawa

[11] Patent Number: 5,977,603
[45] Date of Patent: *Nov. 2, 1999

[54] INFRARED DETECTOR AND FABRICATION METHOD THEREOF

[75] Inventor: Tomohiro Ishikawa, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/693,602

[22] Filed: Aug. 7, 1996

[30] Foreign Application Priority Data

Dec. 18, 1995 [JP] Japan ................................. 7-328672

[51] Int. Cl.⁶ ........................ H01L 29/47; H01L 31/07; H01L 31/108
[52] U.S. Cl. ......................... 257/451; 257/449; 257/73; 257/467; 257/470; 250/338.3; 250/338.4
[58] Field of Search ........................... 257/73, 449, 451, 257/467, 470; 250/338.3, 338.4

[56] References Cited

U.S. PATENT DOCUMENTS

| | | | |
|---|---|---|---|
| 2,588,254 | 3/1952 | Lark-Horovitz | 257/470 |
| 4,211,888 | 7/1980 | Stein | 257/470 |
| 4,244,750 | 1/1981 | Chenevas-Paule | 257/54 |
| 4,826,777 | 5/1989 | Ondris | 257/73 |
| 5,010,251 | 4/1991 | Grinberg et al. | |

FOREIGN PATENT DOCUMENTS 2-78273  3/1990  Japan ........................................ 257/54

OTHER PUBLICATIONS

"The Electrical Properties of Polycrystalline Silicon Films" by John Seto, *Journal of Applied Physics*, vol. 46, No. 12, Dec. 1975.
"Schottky Barrier Thermistor" by Kimura et al, *Technical Digest of the 11th Sensor Symposium* 1992 pp. 107–110.
Infrared Linear Image Sensor Using a Poly–Si pn Junction Diode Array by Tanaka et al, *Infrared Phys.*, vol. 33, No. 4, pp. 229–236, 1992.

*Primary Examiner*—Jerome Jackson, Jr.
*Attorney, Agent, or Firm*—Sughrue, Mion, Zinn, MacPeak & Seas, PLLC

[57] ABSTRACT

In a IR detector and a fabrication method thereof, the IR detector has a insulating thin film (3) made up of insulating material, many semiconductor layers (1) each having an island shape formed on the insulating thin film (3), a forward bias connection section (5) and a backward bias connection section (6) formed for each semiconductor layer (1) to be forward and backward biases to an external bias voltage, and a metal thin film (2) for electrically connecting the semiconductor layers (1) to each other through both the forward bias connection section and the backward bias connection section (5 and 6).

16 Claims, 7 Drawing Sheets

INFRARED DETECTOR AND FABRICATION METHOD THEREOF

BACKGROUND OF THE INVENTION

1. Field of the Invention

The present invention relates to an infrared detector which is capable of absorption and detecting infrared radiation from various objects, and more particularly, it relates to a bolometer type infrared detector for detecting infrared radiation radiated from object bodies by using materials incorporated in the infrared detector whose resistance value is changed based on the change of temperature value caused by absorption of the infrared radiation.

2. Description of the Prior Art

A bolometer type infrared (IR) detector absorbs infrared radiation from various objects. A resistance value of the section made up of a resistance material in the bolometer type IR detector is heated by the absorption of the IR radiation. This temperature change causes the change of the resistance value of the resistance material. The bolometer type IR detector detects and absorbs the existence of the object that radiates this IR radiation by measuring the change of bias current or bias voltage applied to the resistance material.

Figure 13A:
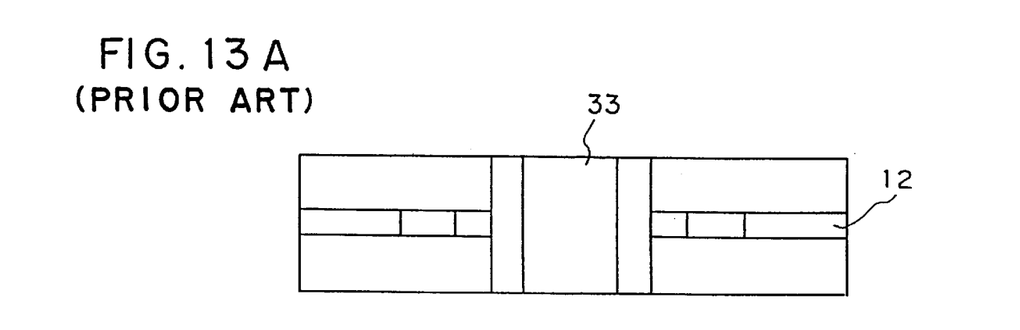
FIGS. 13A and 13B are a plan view and a sectional view, respectively, showing detection elements in a conventional IR detector.
Figure 13B:
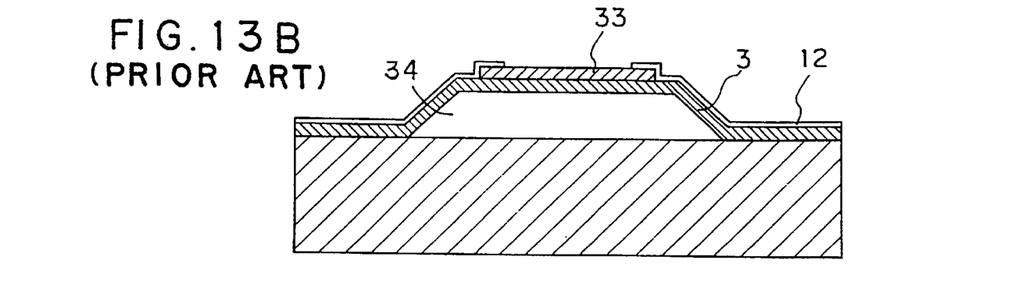

FIG. 13A is a plan view of a detection element section in a conventional bolometer type IR detector which is disclosed in literatures, for example, disclosed in the literature of U.S. Pat. No. 5,260,225. FIG. 13B is a sectional view showing a configuration of the detection element section, as shown in FIG. 13A. In the same diagrams, a reference number 33 designates a resistance material section. A reference number 12 indicates a lead that is made up of a metal through which a bias voltage or a bias current is applied to the resistance material section 33. A reference number 3 denotes an insulating thin film that is made up of an insulator material such as $SiO_2$, for example.

In this detector element in the conventional bolometer IR detector shown in FIG. 13B, a hollow section 34 is formed under the lower section of the insulating thin film 3 in order to increase effectively the temperature of the resistance material section 33 caused by the incidence of IR radiation to the resistance material. In general, a metal thin film such as a platinum (P) and a titanium (Ti), or a ceramic such as a vanadium oxide, or a semiconductor such as a poly-crystal silicon and an amorphous silicon is used as the resistance material 33.

The Temperature Coefficient of Resistance (hereinafter referred to as "TCR") is designated as follows:

$$(1/R) \times (dR/dT) [\%/k],$$

where R is a resistance value of the resistance material section and T is the absolute temperature. In general, The TCR value of a metal thin film has +0.1 [%/k], a semiconductor has −2.0[%/k], and a vanadium oxide (VOx) has −2.0 [%/k] or more.

Using vanadium oxide having a large TCR value has the benefit of increasing sensitivity of the bolometer type IR detector. However, there is also a possibility of causing a contamination of devices and the like. The vanadium oxide is therefore not used in semiconductor manufacturing lines to fabricate general semiconductor integrated circuits.

In IR arrays of a large scale integration of two dimensions such as solid state camera devices (or solid state imaging devices) in which detection elements for detecting IR radiation from objects are integrated, because integrated circuits of silicon are fabricated around peripheral sections of the integrated detection elements in order to read electrical signals, it can be carried out to fabricate the detection elements in IR detectors at a low cost and in high productivity when fabrication processes to fabricate the IR detection elements are introduced into fabrication processes of silicon semiconductor integrated circuits. Accordingly, it has advantages to use a semiconductor such as a polycrystalline silicon or an amorphous silicon as the resistance material 33 in the IR detector.

The mechanism of electric conduction in a polycrystalline silicon including dopants is designated by the sum of conductivity in the crystal and the conductivity through trap levels of crystal particles, as shown in one dimensional model of crystals connected in series disclosed by Seto et al. (see the Journal Of Applied Physics, vol.46, No.12, 1975, pp. 5247–5254, "The electrical properties of polycrystalline silicon films" by Seto, et al.).

When the number of carriers in the crystal is small, the carriers cannot fill all of the trap levels and form an electric barrier in the crystal particles. On the other hand, when the number of carriers in the crystal is greater, the carriers fill all of the trap levels and remaining carriers change the Fermi level in a crystal and decrease the level of the electric barrier. Where this electric barrier is designated by a reference character Ea (eV), the value of TCR can be designated by $TCR = Ea/kT^2$.

When a polycrystalline silicon is used as the resistance material in a bolometer type IR detector, because the sensitivity of the IR detector is directly proportional to the value of TCR of the polycrystalline silicon, the level Ea of the electric barrier must be increased in order to form the IR detector with a high sensitivity. However, when the level Ea of the electric barrier becomes high, the electric conduction through the crystal is carried out based on the trap levels of the crystal particles. In this case, the magnitude of 1/f noise in the IR detector is greater. In general, because the performance of a bolometer type IR detector is measured based on the rate of a noise level in the level of output signal transferred from the IR detector, the performance of the bolometer type IR detector having the value of a greater 1/f noise becomes low. This problem is also caused when an amorphous silicon is used as the resistance material in the IR detector.

In addition, although the TCR value can be increased to approximately −8 [%/K] by decreasing the amount of dopants in the polycrystalline silicon as the resistance material, the resistance value is increased. In this case, it becomes difficult to match impedances between the bolometer type IR detector side and a signal processing circuit side for reading or receiving output signals transmitted from the bolometer type IR detector. This is also one of the problems involved in the conventional bolometer type IR detector described above.

SUMMARY OF THE INVENTION

Accordingly, an object of the present invention is, with due consideration to the drawbacks of conventional IR detector, to provide an IR detector and a fabrication method thereof, which is made up of materials used in semiconductor fabrication process lines and which has a high performance such as a high TCR value, an optimum resistance value and a small 1/f noise value.

In accordance with a preferred embodiment of the present invention, an infrared (IR) detector comprising a insulating thin film made up of insulating material, a plurality of semiconductor layers formed on the insulating thin film, a forward bias connection section and a backward bias connection section formed for each of the plurality of semiconductor layers to be a forward bias and a backward bias to an external bias voltage, a metal thin film for electrically connecting the plurality of semiconductor layers to each other through the forward bias connection section and the backward bias connection section.

In addition, in the IR detector described above, each of the plurality of semiconductor layers has an island shape and both the forward bias connection section and the backward bias connection section are formed on the plurality of semiconductor layers.

Further, in the IR detector described above, the forward bias connection section and the backward bias connection section are formed so that the metal thin film is buried between the plurality of semiconductor layers.

Moreover, in the IR detector described above, a P-N junction is formed in each of the plurality of semiconductor layers by fabricating a P+ region in one section in one semiconductor layer between the forward bias connection section and the backward bias connection section and for fabricating N+ region in other section in the semiconductor layer.

In addition, in the IR detector described above, the forward bias connection section and the backward bias connection section are a Schottky barrier.

Furthermore, in the IR detector described above, the plurality of semiconductor layers are formed on a silicon on insulator (SOI) substrate.

In addition, in the IR detector described above, the IR detector is formed so that a concentration of the semiconductor layer section between the forward bias connection section and the backward bias connection section is greater than a concentration of the semiconductor layer section near to the both the forward bias connection section and the backward bias connection section.

Further, in the IR detector described above, an impurity concentration of the semiconductor layer at the backward bias connection section side is higher than an impurity concentration of the semiconductor layer near to the forward bias connection section.

In accordance with another preferred embodiment according to the present invention, a fabrication method of fabricating IR detectors comprises steps for implanting ions into a plurality of semiconductor layers formed on an insulating thin film in order to form a plurality of metal thin films as a plurality of implanted sections and for electrically connecting a plurality of non-implanted sections which are not implanted and the plurality of implanted sections to each other.

In addition, in the fabrication method of fabricating the IR detectors described above, the plurality of semiconductor layers are formed on a silicon on insulator (SOI).

Further, in the fabrication method of fabricating the IR detectors described above, further comprises a step for implanting impurity to the plurality of non-implanted sections to which no ion is implanted so that the concentration of sections between the implanted sections is greater than the concentration of the non-implanted sections near to the implanted sections.

In addition, in the fabrication method of fabricating the IR detectors described above, an impurity concentration of the non-implanted section in one surface region between the implanted section and the non-implanted section is greater than an impurity concentration of the non-implanted section near to other surface region.

These and other objects, features, aspects and advantages of the present invention will become more apparent from the following detailed description of the present invention when taken in conjunction with the accompanying drawings.

DESCRIPTION OF THE PREFERRED EMBODIMENTS

Firstly, we will explain the concept of features of an infrared (IR) detector and a fabrication method thereof according to the present invention, and then describe IR detectors and fabrication method thereof as preferred embodiments of the present invention in detail.

Concept and features of the present invention

Figure 1A:
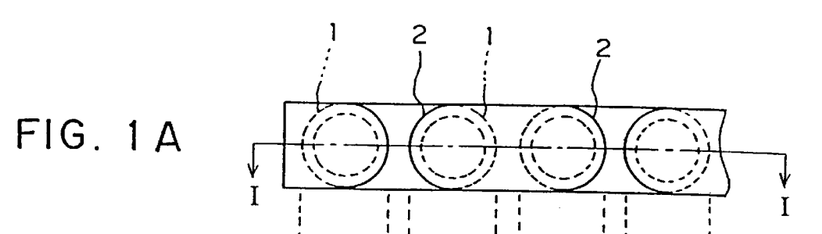
FIGS. 1A to 1C are a plan view, a sectional view of A—A line and an equivalent circuit diagram, respectively, showing a feature part of an IR detector as the first embodiment according to the present invention.
Figure 1B:
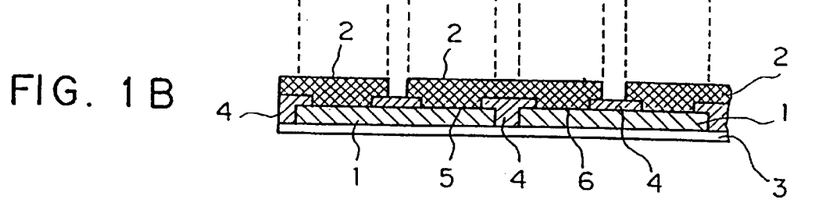

FIGS. 1A to 1C are diagrams showing feature sections of the IR detector as a preferred embodiment of the present invention. FIG. 1A is a plan view of the IR detector and FIG. 1B is a sectional view of A—A line in FIG. 1A. As shown in FIGS. 1A and 1B, the IR detector of the present invention comprises an insulating thin film 3, a plurality of semiconductor layers 1 formed on the insulating thin film 3 and a plurality of metal thin films 2 for connecting the plurality of semiconductor layers 1 to each other in series through a forward bias connection section 5 and a backward bias connection section 6 to external bias voltage (it can be acceptable that the reference number 6 means the forward bias connection section and 5 denotes the backward bias connection section 6). The forward bias connection section and the backward bias connection section are formed for each semiconductor layer 1.

That is, the forward bias connection section 5 is a contact region and is formed between the metal thin film 2 and the semiconductor layer 1. Similarly, the backward bias connection section 6 is also a contact region and is formed between the metal thin film 2 and the semiconductor layer 1.

Figure 1C:
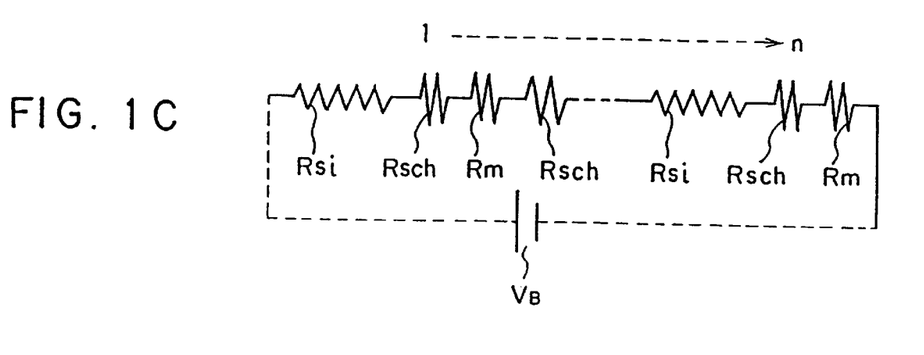

In the configuration of the IR detector of the present invention, as shown in FIGS. 1A and 1B, when a bias voltage $V_B$ is applied to the IR detector in which the semiconductor layers of N (N is an integer more than at least two) are formed, as shown in the equivalent circuit diagram of FIG. 1C, carriers flow through the resistance $R_{Si}$ of the semiconductor layer 1, the Schottky barrier resistance $R_{SCH}$ of Schottky barrier of the forward bias connection section 5, the resistance Rm of the metal thin film 2 and the Schottky barrier resistance $R_{SCH}$ of Schottky barrier of the backward bias connection section 6, repeatedly. The magnitude of the total resistance of the IR detector is represented by $(R_{Si}+R_{SCH}+Rm)\times N$.

Because the value Rm of the metal thin film 2 is small, the total resistance of the IR detector becomes the sum of the value $R_{Si}$ of the resistance and the Schottky barrier resistances $R_{SCH}$. In this case, the total resistance value becomes the value of $(R_{Si}+R_{SCH})\times N$.

When the voltage potential difference between the forward bias connection section 5 and the backward bias connection section 6 in the Schottky barriers is $V_{SCH}$, the voltage potential difference $V_{Si}$ in the semiconductor layer 1 and the level of the original Schottky barrier is Vb, the level Vb becomes lower and the level of the Schottky barrier becomes Vb'.

The relationship between the values $V_B$, $V_{SCH}$, $V_{Si}$, Vb, Vb' are designated by the following equations (1) to (4).

$$V_{SCH}+V_{Si}=V_B/N \quad (1)$$

$$Vb'=(Vb-V_{SCH}/2) \quad (2)$$

$$I=S\times A^*\times T^2\times exp\,(-(Vb-V_{SCH}/2))/kT=S\times A^*\times T^2\times exp(-Vb'/kT) \quad (3).$$

We can obtain the following equation (4) from the equation (3), $$TCR=(Vb-V_{SCH}/2)/kT=Vb'/kT^2 \quad (4).$$

In the equations (1) to (4) described above, a reference character S designates the area of the surface of each of the forward bias connection section 5 and the backward bias connection section 6, and a reference character A* denotes Rechardson's number. As clearly understood by the above equation (1), the voltage $V_{SCH}$ to be applied to the Schottky barrier can be changed by changing the number of the connection numbers (the number of both the forward bias connection section 5 and the backward bias connection 6) in the semiconductor layers 1.

In addition, as shown in the equation (2), when the bias voltage $V_{SCH}$ is applied, the level of the Schottky barrier becomes low. Accordingly, it can be said that the level of the Schottky barrier after applying of the bias voltage is defined based on the original Schottky barrier level Vb of the Schottky barrier, the magnitude of the bias voltage $V_B$ and the number of the forward bias connection section and backward bias connection section. As clearly understood by the equation (4), the value of TCR can be increased when the original Schottky barrier level Vb of the Schottky barrier is high. Although the sensitivity of the IR detector can be increased when the value of TCR becomes high, the magnitude of the resistance of the IR detector is also increased. In this case, it becomes difficult to match both impedances of the IR detector and a signal readout circuit (not shown) to read detection signals transferred from the IR detector. In order to overcome this dilemma involved in the IR detector, the present invention provides the IR detector in which the kind of the material made up of a metal thin film, the connection number N of bias connection sections and the magnitude of the bias voltage $V_B$ are selected in order to obtain the optimum value of the resistance of the IR detector. In addition, these are also selected in order to have the largest level of the Schottky barrier Vb'. Thereby, the impedance matching between the IR detector and the read-out circuit (not shown) can be performed in optimum state and the sensitivity of the IR detector can be increased.

In addition, in the configuration of the IR detector of the present invention, as shown in FIG. 1B, the semiconductor layers 1 each having an island shape are formed in the insulating thin film 3, and the semiconductor layers 1 are electrically connected to each other in series through the metal thin films 2. In this configuration of the IR detector, the resistance value can be decreased without changing the value of TCR when the areas of the forward bias connection section 5 and the backward bias connection section 6 are increased. On the other hand, when the areas of these bias connection sections 5 and 6 are increased, the resistance value of these bias connection sections will be decreased and the level of the Schottky barrier can be increased. Thereby, the value of TCR can be increased without changing the total resistance value of the IR detector. The impedance matching between the IR detector and the signal readout circuit (not shown) can be matched and the sensitivity of the IR detector can be increased.

Figure 6A:
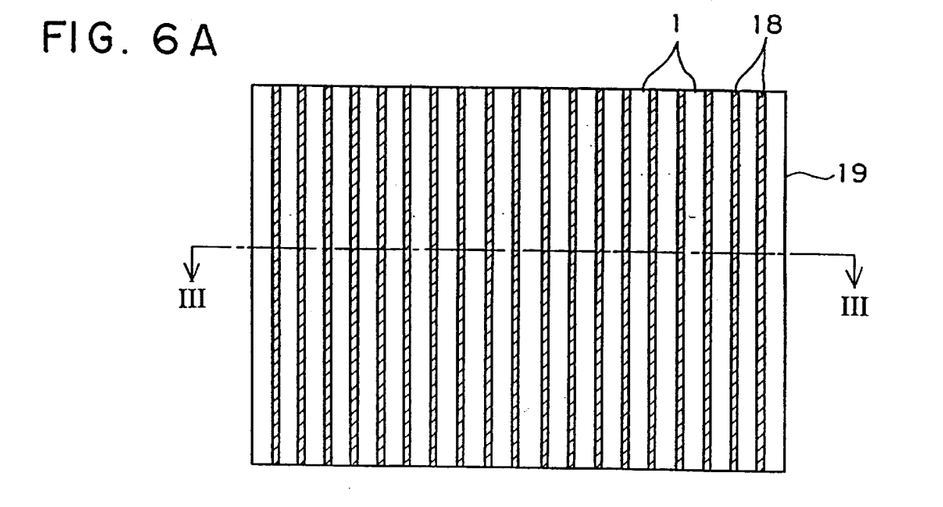
FIGS. 6A and 6B are a plan view and a sectional view of C—C line, respectively, showing a feature section of an IR detector of the fourth embodiment according to the present invention.
Figure 6B:
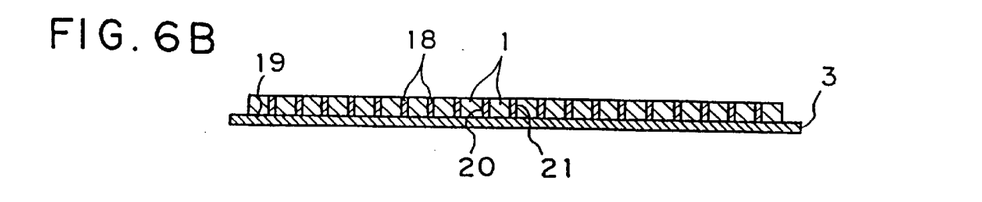

Although the plurality of semiconductor layers of the island shapes are electrically connected in series in the above configuration, it can be acceptable to form the metal thin films 2 each thin film 2 is buried between a pair of the semiconductor layers 1 which are adjacent to each other through the surfaces 21 and 22, as shown in FIGS. 6A and 6B.

By using the configuration shown in FIGS. 6A and 6B, the value of TCR can be increased and the size of the IR detector can be decreased when an optimum length and an optimum thickness of the semiconductor layer 1 in thickness direction and longitudinal direction are selected so that the surface area of the semiconductor layer 1 becomes increased. In this case, the IR detector has a simple configuration and the number of fabricating processes can be decreased.

The IR detector shown in FIGS. 6A and 6B can have the P-N junctions as an electric barrier, like the Schottky barrier, as shown in FIGS. 1A to 1C and FIGS. 2A and 2B.

Figure 11:
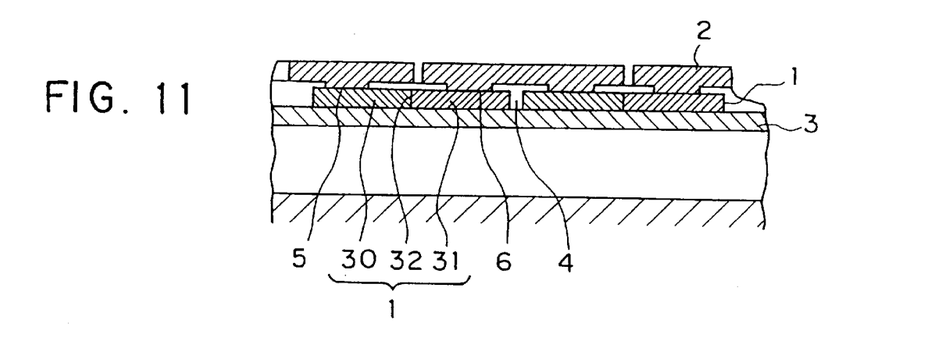
FIG. 11 is a sectional view showing an IR detector of the sixth embodiment according to the present invention.

The IR detector, as shown in FIG. 11, has the configuration that a P-N junction 32 is formed by fabricating a P+ region and a N+ region (30 and 31) in the semiconductor layer 1 at the forward bias connection section 5 side and the backward bias connection section 6 side, respectively. In addition, the plurality of semiconductor layers 1 are electrically connected in series through the forward bias connection section 5, the backward bias connection section 6 and the metal thin film 2.

This P-N junction 32 performs as an electric barrier, like the Schottky barrier, and provides a larger TRC value in an IR detector. In addition, because impurities are doped into the P+ region 30 and the N+ region 31 with a high concentration, both the forward bias connection section 5 and the backward bias connection section 6 become an ohmic junction and, further, the P+ region 30 and the N+ region 31 have a low resistance value, respectively. Accordingly, the 1/f noise in the IR detector based on the resistance can be decreased and the impedance matching between the IR detector and an readout circuit (not shown) can also be improved. Thus, the present invention can provide the IR detector having a large TCR value and a high sensitivity function.

Figure 4:
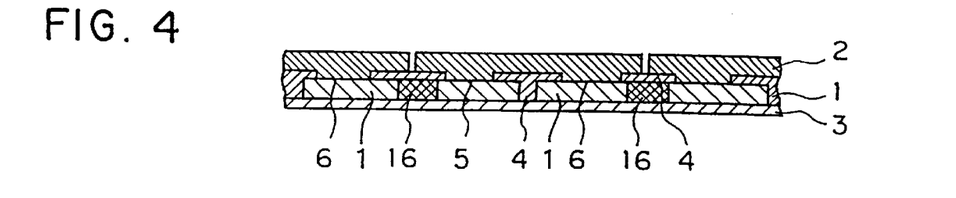
FIG. 4 is a sectional view showing a feature section of an IR detector of the second embodiment according to the present invention.

In the IR detector shown in FIG. 4, a high impurity concentration region 16 is formed in the semiconductor layer 1 between the forward bias connection section 5 and the backward bias connection section 6. In detail, the impurity concentration of the high impurity concentration region 16 is larger than the concentration of the region near to the forward bias connection section 5 and the backward bias connection section 6.

In the configuration of the IR detector shown in FIGS. 6A and 6B, similarly to the configuration described above, it can be acceptable that the impurity concentration of the semiconductor layer 1 formed between the surfaces (connection sections) 20 and 21 is higher than the concentration of a region of the semiconductor layer 1 near to the surfaces 20 and 21.

The resistance value of the semiconductor layer 1 can be decreased by forming the high impurity concentration region 16 in the semiconductor layer 1 and the Schottky barrier resistance can also be decreased in proportion to decreasing of the resistance value of the semiconductor layer 1. Therefore the value of TCR can be increased without changing of the total resistance value of the IR detector and the magnitude of 1/f noise caused by the resistance in the semiconductor layer 1 can also be decreased.

Figure 5:
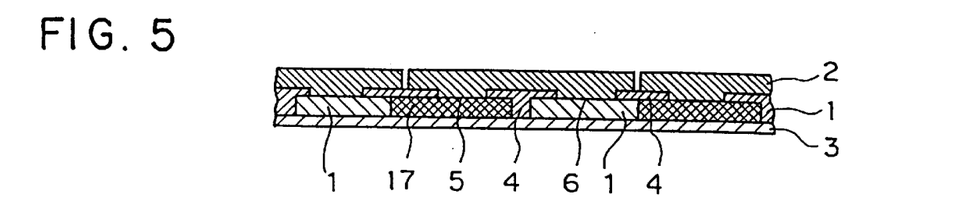
FIG. 5 is a sectional view showing a feature section of an IR detector of the third embodiment according to the present invention.

In the configuration of an IR detector, as shown in FIG. 5, the impurity concentration of the semiconductor layer 1 at the forward bias connection section 5 side is larger than that of the semiconductor layer 1 near to the backward bias connection section 6 in order to form the high impurity concentration region 17 in the semiconductor layer 1. In the configuration of the IR detector shown in FIGS. 6A and 6B, it can be acceptable that a high impurity concentration region 24 is formed in the backward bias connection section connected to the metal thin film 18, as shown in the sectional view of FIG. 8. In those cases described above, it can be also acceptable that the connection section 6 is formed as the forward bias connection section and the connection section 5 is fabricated as the backward bias connection section.

Figure 8:
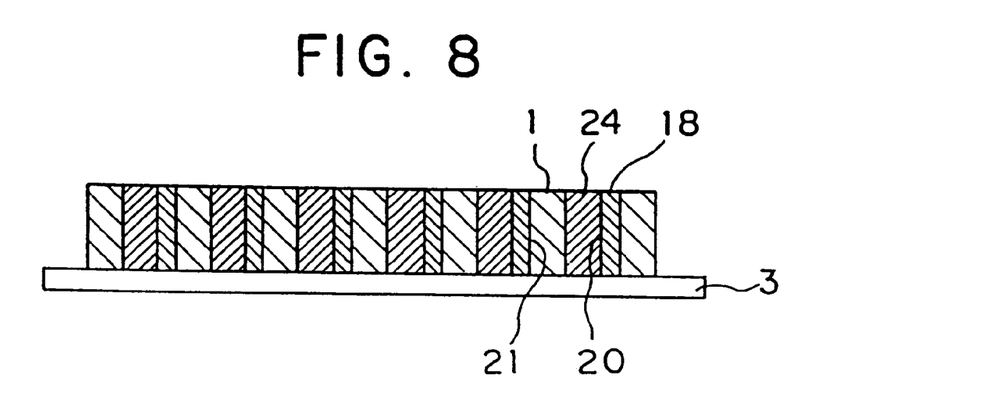
FIG. 8 is a sectional view showing another configuration of the IR detector of the fourth embodiment shown in FIGS. 6A and 6B.

In general, there is a possibility that the backward bias connection section has a high resistance value. But, by forming the high impurity concentration regions 17 and 24, the total resistance value of the semiconductor layer 1 becomes low and the backward bias connection section becomes an ohmic junction. Accordingly, the value of TCR of the IR detector is increased without changing of the total resistance value of the IR detector and the 1/f noise caused by the resistance of the semiconductor layer 1 is decreased.

In addition, in general, a semiconductor layer as a silicon on insulator (SOI) substrate has an excellent crystal property. In the configurations of the IR detectors, as shown in FIGS. 1A to 1C, FIGS. 2A and 2B and FIGS. 6A and 6B, because the stable Schottky barrier and the P-N junction 32 can be formed when a semiconductor layer formed on a SOI is used, the IR detectors having a stable TCR, a stable characteristic and a low 1/f noise will be obtained.

Figure 7A:
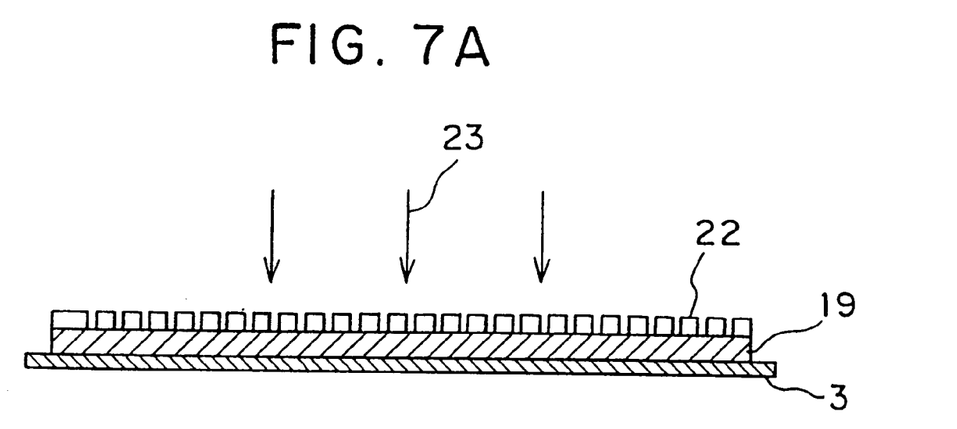
FIGS. 7A and 7B are sectional views showing a fabrication method of fabricating the IR detector of the fourth embodiment, as shown in FIGS. 6A and 6B.
Figure 7B:
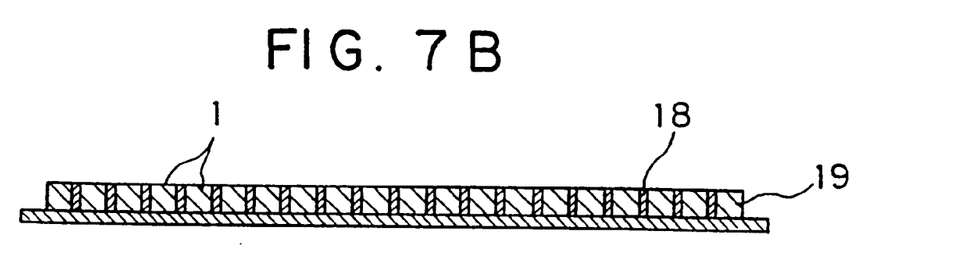

FIGS. 7A and 7B are sectional views showing a fabrication method of fabricating the IR detector, as shown in FIGS. 6A and 6B.

In the fabrication method of the IR detector, as shown in FIG. 7A, a semiconductor thin film layer 19 is formed on an insulating thin film 3. After patterning of an organic resist 22 is performed, metal ions 23 are implanted into the semiconductor layer film 19 on an insulating thin film 3. As shown in FIG. 7B, the metal thin film 18 is formed on the ion implanted section of the metal ions 23, the semiconductor layer film 19 is divided into a plurality of semiconductor layers 1 and these semiconductor layers 1 are electrically connected to each other through surfaces formed between each metal thin film 18 and each of the plurality of semiconductor layers 1. In the fabrication method of IR detectors as shown in FIGS. 7A and 7B, by selecting optimum values of the semiconductor layer 1 in thickness length direction and longitudinal direction so that the area of the Schottky barrier is increased, so that the value of TCR can be increased and the size of the IR detector can be small. In this case, the configuration of the IR detector becomes simple and the number of fabrication processes can be decreased.

FIGS. 9A to 9E are sectional views showing the fabrication method of an IR detector using a SOI substrate.

Figure 9A:
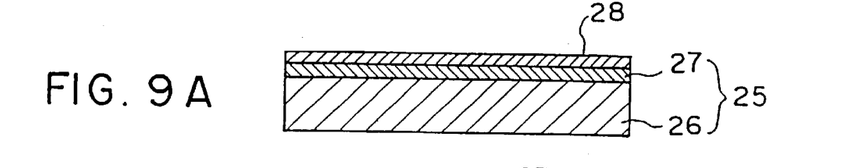
FIGS. 9A to 9E are sectional views showing a fabrication method of fabricating an IR detector of the fifth embodiment according to the present invention.
Figure 9B:
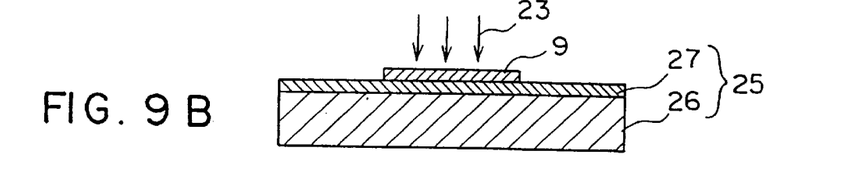

As shown in FIG. 9A, in this fabrication method, by using the SOI substrate 25 in which the semiconductor layer film 28 made up of a single crystal silicon doped by impurity is formed on the silicon substrate 26, the semiconductor layer film 28 is patterned with a desired area, as shown in FIG. 9B. Then, as shown in FIGS. 7A and 7B, the metal ions are implanted into the semiconductor layer film 28 in order to form the metal thin film 18. The semiconductor layer film 28 are divided into a plurality of semiconductor layers 1 and a chain 9 to connect the plurality of semiconductor layers 1 to each other in series through surfaces formed between the plurality of semiconductor layers 1 and the metal thin film 18.

The detailed fabrication method of the IR detector of the present invention will be explained later.

By using the fabrication method of IR detector as shown in FIGS. 9A to 9E, because an SOI substrate 25 in good crystal is used, obtained IR detector have a stable Schottky barrier and stable performance to detect IR radiation. In addition, the 1/f of the IR detectors can be decreased and the number of fabrication processes can also be decreased, because the plurality of semiconductor layers 1 are formed by using good crystalline materials.

In addition, in the fabrication methods of the IR detectors, as shown in FIGS. 7A and 7B and FIGS. 9A to 9E, because the resistance of the semiconductor layer 1 is decreased and the resistance of Schottky barrier can be increased in proportion to the decreasing of the resistance and the value of TCR is greatly increased by increasing the concentration of the semiconductor section 1 near to the metal thin film 18 rather than that of the semiconductor layer 1 between surfaces, the IR detector having a highly characteristic and performance can be provided.

In addition, in the fabrication methods of the IR detectors as shown in FIGS. 7A and 7B and FIGS. 9A to 9E, by increasing a higher impurity concentration of a plurality of semiconductor layers 1 in one surface areas rather than that of the semiconductor layers 1 near to the other surface region, the backward bias connection region is changed to an ohmic junction region, so that the resistance of the semiconductor layer 1 can be decreased. Thereby, the value of TCR can be increased without changing the total resistance value of the IR detector and the 1/f noise caused by the resistance of the semiconductor layer 1 can be decreased.

Hereinafter, configurations and operations of IR detectors and fabrication methods of preferred embodiments according to the present invention will be explained in detail.

Embodiment 1.

FIGS. 1A to 1C are a plan view, a sectional view of A—A line and an equivalent circuit diagram, respectively, showing a feature part of an IR detector as the first embodiment according to the present invention.

In FIGS. 1A and 1B, a reference number 3 designates an insulating thin film which is made up of an insulator such as $SiO_2$. A reference number 1 denotes semiconductor layers of an island shape which is made up of materials such as semiconductor materials in which an impurity such as Phosphorus (P) and Boron (B) of approximately $10^{17}$ [/cm$^3$] is doped into poly crystalline silicon or amorphous silicon formed on the insulation thin film, 2 indicates metal thin films 2 through which the plurality of semiconductor layers 1 are electrically connected in series, which are made up of TiSi, Ti, Pi or PtSi and the like. The surface between the forward bias connection section 5 and the backward bias connection section 6 of the semiconductor layer is formed as an electric barrier (hereinafter referred to as "Schottky barrier") having the area S=4 μm×4 μm.

In the explanation for the first embodiment, we will use a word "a chain" to indicate the configuration in which the plurality of semiconductor layers 1 are electrically connected in series. A reference number 4 designates an insulator which is made up of a $SiO_2$ material or the like for insulating the semiconductor layer 1 from sections other than the forward bias connection section 5 and the backward bias connection section 6 formed between each semiconductor layer 1 and each metal thin film 2.

By using the IR detector of the first embodiment 1, we calculated physical values of characteristics of the case in which semiconductor layers 1 of six items are electrically connected to each other through the metal thin film 2. As calculation results, we estimated that the total resistance of the IR detector was 27 [kΩ] and the value of TCR was 1.9 [%/k].

In general, when the value of TCR is increased when the level of Schottky barrier becomes high, but the total resistance of the IR detector is decreased in proportion to the increasing of the sensitivity of the IR detector. In this case, it becomes difficult to match impedance matching between the IR detector and a readout circuit (not shown) for receiving detected signals transferred from the IR detector. In the IR detector of the first embodiment, in order to overcome this problem, a kind of the metal thin film 2, the number of the semiconductor layers 1 to be electrically connected through the metal thin film 2 and the optimum bias voltage are selected. In addition, these values are also selected in order to obtain the maximum level of Schottky barrier. Thereby, the sensitivity of the IR detector can be increased in addition to matching of the impedance between the IR detector and the signal readout circuit (not shown).

In addition, when the areas of the bias connection sections 5 and 6 are increased, the total resistance value can be decreased without changing of the value of TCR. Further, the total resistance value can be decreased within a constant range by increasing the value of TCR and the areas of the bias connection sections 5 and 6.

Figure 2A:
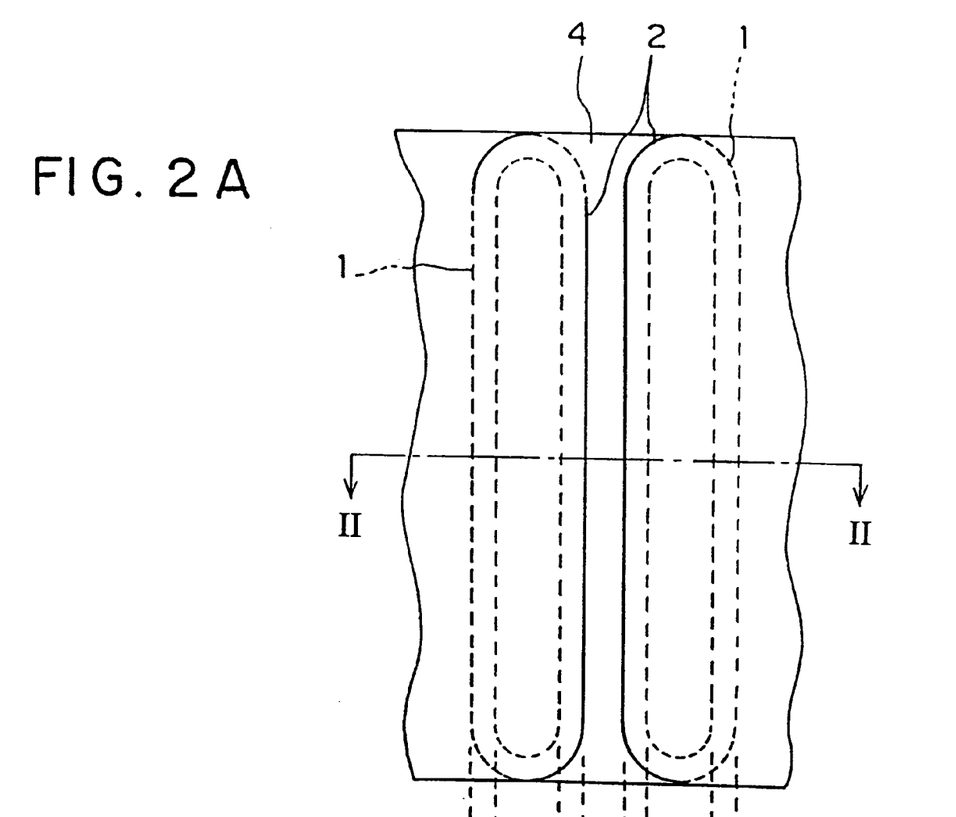
FIGS. 2A and 2B are a plan view and a sectional view, respectively, of B—B line of the IR detector of the first embodiment according to the present invention.
Figure 2B:
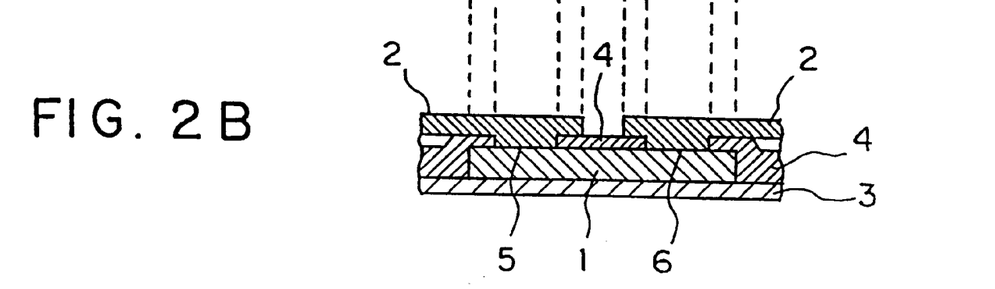

FIGS. 2A and 2B are a plan view and a sectional view of B—B line, respectively, in another configuration of the IR detector of the first embodiment according to the present invention. In this configuration, TiSi is used as the metal thin film 2, a P conductivity type silicon having an impurity concentration of $10^{17}$ [/cm$^3$] and the level Vb of the Schottky barrier of 0.5 [eV] is used as the semiconductor layers 1, both the areas S of the forward bias connection section 5 and the backward bias connection section 6 are $9.0×10^{-7}$ [cm$^2$], respectively, and the number of the semiconductor layers connected in series to each other is 10. In the IR detector having the above configuration, the total resistance value thereof becomes 26 [kΩ], the estimated TCR value is $-3.2$ [%] when the bias voltage $V_B$ is 5 Volts.

FIGS. 3A to 3J are sectional views showing a fabrication method for fabricating the IR detector of the first embodiment according to the present invention. The fabrication method will be explained with reference to these drawings.

Figure 3A:
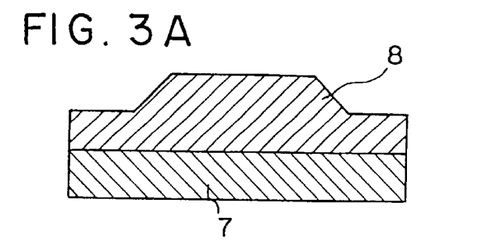
FIGS. 3A to 3J are sectional views showing a fabrication method for fabricating the IR detector of the first embodiment according to the present invention.

First, as shown in FIG. 3A, a pedestal section 8 is formed on the semiconductor substrate 7 of a silicon and the like by using a polycrystalline silicon, an amorphous silicon, or the like.

Figure 3B:
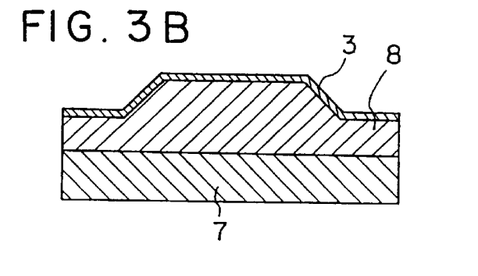
Figure 3C:
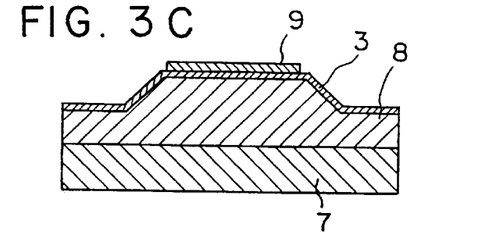

Next, as shown in FIG. 3B, an insulating thin film 3 of a thickness 200 [nm] is formed so as to cover the pedestal section 8 by using a chemical vapor deposition (CVD). Then, as shown in FIG. 3C, the chain 9 between the semiconductor layer and the metal thin film is formed.

Figure 3D:
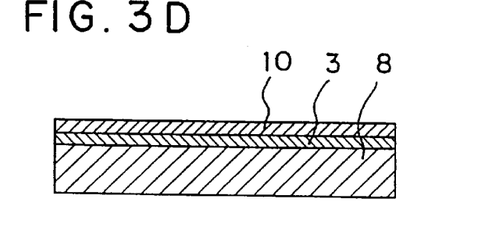
Figure 3E:
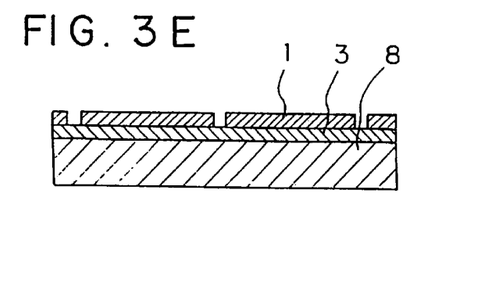
Figure 3F:
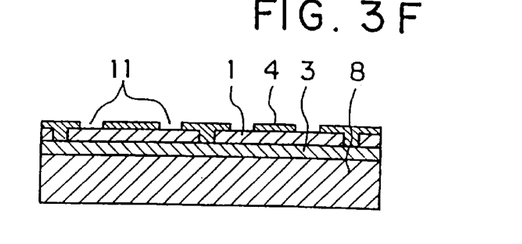
Figure 3G:
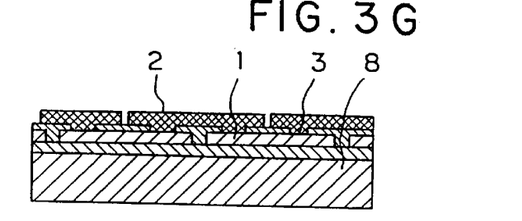

FIGS. 3D to 3G are enlarged views to explain the fabrication method of the chain 9. As shown in FIG. 3D, a semiconductor layer film 10 which is doped with an impurity material of approximately $10^{-7}$ [/cm$^2$] such as P (Phosphorus) or B (Boron) is formed on the insulating thin film 3 by using a spattering method or a CVD method. Then, as shown in FIG. 3E, the semiconductor layer film 10 is formed on the plurality of the semiconductor layers 1 by using a resist in a photolithographic technique. $SiO_2$ is then deposited on the semiconductor layers 1. As shown in FIG. 3F, contact holes 11 are formed on the semiconductor layer 1 by using a resist in the photolithographic technique. After eliminating the resist, a Ti film is formed with a Titanium (Ti) material by using a spattering method. The Ti film is patterned to form the metal thin film 2. Thereby, as shown in FIG. 3G, the semiconductor layers 1 are electrically connected in series to each other through the metal thin film 2.

Figure 3H:
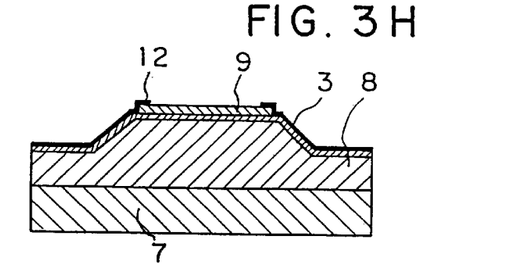
Figure 3I:
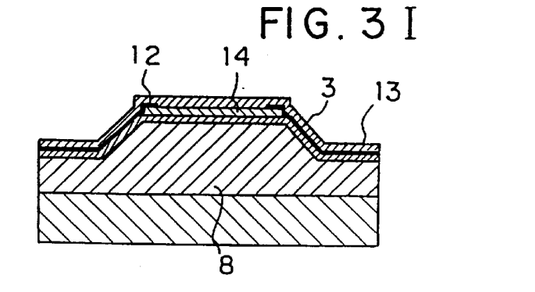
Figure 3J:
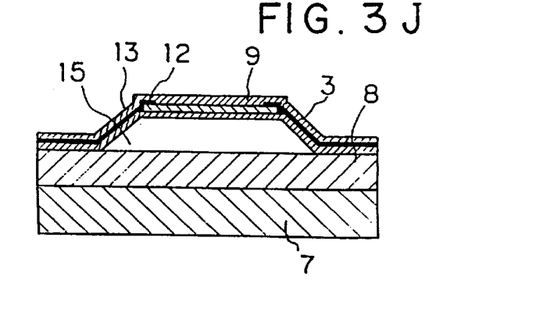

Next, as shown in FIG. 3H, leads 12 are formed. The leads 12 electrically connect the chains 9 (namely, the IR detector) to an external signal readout circuit (not shown). Further, as shown in FIG. 3I, a protective coating film 13 made up of a silicon nitride material is formed, and a hole 14 reached to the silicon pedestal 8 is then formed. After this, as shown in FIG. 3J, a hollow section 15 is formed by etching and eliminating the silicon pedestal 8 by using an enchant such as KOH through the hole 14.

Embodiment 2.

FIG. 4 is a sectional view showing a feature section of an IR detector of the second embodiment according to the present invention. In the same diagram, a reference number 1 designates a semiconductor layer, 2 designates a metal thin film, 3 indicates an insulating thin film, 4 denigrates an insulator material, and 5 and 6 denote bias connection sections which are the same as the forward bias connection section and the backward bias connection section formed in the IR detector of the first embodiment, The configuration and the fabrication method of the IR detector of the second embodiment is same as those of the IR detector of the first embodiment. The semiconductor layer 1 and the metal thin film 2 are electrically connected through the bias connection sections 5 and 6. A reference number 16 designates a high impurity concentration region which is doped with an impurity such as Boron (B) of $10^{19}$ [cm$^3$] or more into a region in the semiconductor layer 1 between the forward bias connection section 5 and the backward bias connection section 6. This high impurity concentration region is formed in an intermediate section in the semiconductor layer 1 by using an ion implantation process after the fabrication processes as shown in FIGS. 3A to 3E. Then, the IR detector of the second embodiment can be fabricated after the completion of the processes as shown in FIGS. 3F to 3I.

In the IR detector of the present invention, because the high impurity concentration region 16 is formed in the semiconductor layer 1, the resistance value of the semiconductor layer 1 can be decreased and the resistance of the Schottky barrier can be increased in proportion to the decreasing of the resistance value of the semiconductor layer 1 without changing of the total resistance value of the IR detector. Thereby, the performance of the IR detector can be increased.

In addition, by forming the high impurity concentration region 16 at an intermediate region of the semiconductor layer 1 described above, a 1/f noise value caused by the resistance of the semiconductor layer 1 can also be decreased.

Embodiment 3.

FIG. 5 is a sectional view showing a feature section of an IR detector of the third embodiment according to the present invention. In the same diagram, a reference number 1 designates a semiconductor layer, 2 designates a metal thin film, 3 indicates an insulating thin film, 4 denigrates an insulator material, and 5 and 6 denote bias connection sections which are the same as the forward bias connection section and the backward bias connection section formed in the IR detector of the first embodiment, The configuration and the fabrication method of the IR detector of the third embodiment is same as those of the IR detector of the first embodiment. The semiconductor layer 1 and the metal thin film 2 are electrically connected through the bias connection sections 5 and 6. A reference number 17 designates a high impurity concentration region which is doped with an impurity of $10^{19}$ [$cm^3$] or more into a region in the semiconductor layer 1 near to the bias connection section 5 or near to the bias connection section 6.

This high impurity concentration region 17 is formed in the semiconductor layer 1 at one side of the bias connection sections 5 and 6 by using an ion implantation process after the fabrication processes as shown in FIGS. 3A to 3E.

The IR detector of the third embodiment is formed by the fabrication processes, as shown in FIGS. 3F and 3I, which are carried out after the completion of the fabrication processes shown in FIGS. 3A to 3E, the high impurity concentration region 17 is formed by using the ion plantation method.

In general, one of the bias connection sections 5 and 6 has a backward bias characteristic when the bias voltage is applied to an IR detector. On the other hand, in the IR detector of the third embodiment, the high impurity concentration region 17 becomes an ohmic junction, so that the resistance value of the backward bias connection section side 5 or 6 can be decreased largely.

In addition, similarly to the IR detector of the second embodiment, by forming the high impurity concentration region 16 in the semiconductor layer, the resistance value of the semiconductor layer 1 can be decreased, the value of TCR can be increased and the value of 1/f noise can also be decreased without changing the total resistance value of the IR detector.

Embodiment 4.

FIGS. 6A and 6B are a plan view and a sectional view of C—C line, respectively, showing a feature section of an IR detector of the fourth embodiment according to the present invention. In the same diagrams, a reference number 3 designates an insulating thin film, 19 indicates a semiconductor layer film which is made up of a poly crystalline or an amorphous silicon that is doped with the impurity concentration of approximately $10^{17}$[$/cm^3$]. A reference number 1 designates a semiconductor layer, 18 indicates a metal electrode section of TiSi which is formed in the semiconductor layer film 19 by the ion implantation process. In the configuration described above, the semiconductor layers 1 divided into the metal electrode section 18 buried into the semiconductor layer film 19 are electrically connected in series through surfaces (connection sections) 20 and 21 having the area of 0.5 $\mu$m×30 $\mu$m. Each of the surfaces 20 and 21 becomes the Schottky barrier section.

When the semiconductor layers 1 of eight items are electrically connected, the total resistance value of the IR detector becomes 24 [k$\Omega$] and an estimated value of TCR becomes 2.6 [%/k].

FIGS. 7A and 7B are sectional views showing a fabrication method of fabricating the IR detector of the fourth embodiment, as shown in FIGS. 6A and 6B. As shown in FIG. 7A, a resist pattern 22 as a stopper material such as organic resist is formed on the semiconductor layer film 19 in order to mask the area which will become the semiconductor layer 1, and then Ti ions are implanted into this area, and the resist pattern 22 is eliminated as shown in FIG. 7B.

In order to form the IR detector of the embodiment 4, the Ti ions are doped to form the metal electrode section 18 after the completion of the fabrication processes, as shown in FIGS. 3A to 3D. Then, the IR detector is formed after the processes shown in FIGS. 3H to 3J.

In the configuration of the IR detector of the embodiment 4, because the areas of the surfaces 20 and 21 can be increased and the size of the IR detector becomes small, a small sized IR detector having a large value of TCR can be provided. In addition, the number of the fabrication processes can be decreased and the semiconductor layers 1 and the sections of the Schottky barrier can be easily formed. FIG. 8 is a sectional view showing another configuration of the IR detector of the fourth embodiment shown in FIGS. 6A and 6B.

In the IR detector of the embodiment 4, as shown in FIG. 8, the surface 20 or 21 which becomes the backward bias connection section is formed as an ohmic resistance section and whose resistance value becomes greatly low, when impurity is doped into the semiconductor layer 1 near to one of the surfaces 20 and 21 in order to form the high impurity concentration section 24 in the semiconductor layer 1. Thereby, the resistance value of the semiconductor layer 1 can be decreased and the value of 1/f noise can be decreased without changing the total resistance value of the IR detector.

In the explanation of the IR detector of the embodiment 4 described above, although the Ti ions are doped into the semiconductor layer 1, but the present invention is not limited by this, various kinds of metal ions, Pt, Al, Co, W and the like can be used in ion plantation processes.

Embodiment 5.

FIGS. 9A to 9E are sectional views showing fabrication method of fabricating an IR detector of the fifth embodiment according to the present invention.

First, as shown in FIG. 9A, an SOI (silicon on insulator) substrate 25 is prepared in order to form the IR detector. The SOI substrate 25 comprises a silicon plate 26 on which an insulating thin film 27 and a single crystal silicon layer 28 have been formed in order.

Next, similarly to the semiconductor layer 28 on the SOI substrate 25 described in the explanations of embodiments 1 and 4, a chain is formed as shown in FIG. 9B.

This chain 9 is formed by using one of the configurations shown in FIGS. 1A to 1C, FIGS. 2A and 2B, FIG. 4, FIG. 5 and FIGS. 6A and 6B.

Figure 9C:
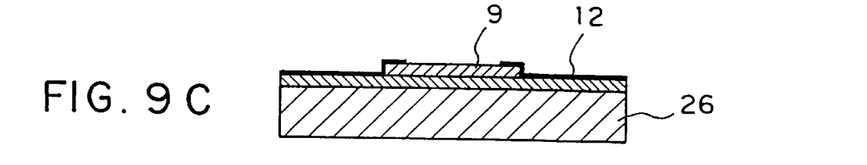
Figure 9D:
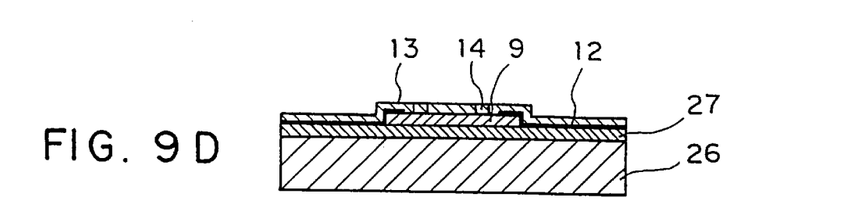

Next, as shown in FIG. 9C, a lead 12 is formed. Through this lead 12 the chain 9 is electrically connected to a signal readout circuit (not shown). Further, as shown in FIG. 9D, a protective film 13 which is made up of a silicon nitride, for example, is formed so as to cover the chain 9, the lead 12, and the like. After this process, a hole 14 penetrated to the silicon plate 26 is formed. The silicon plate 26 is eliminated by an etching process using an etchant such as KOH through the hole 14. Thereby, a hollow section 15 is formed, as shown in FIG. 9E.

Figure 9E:
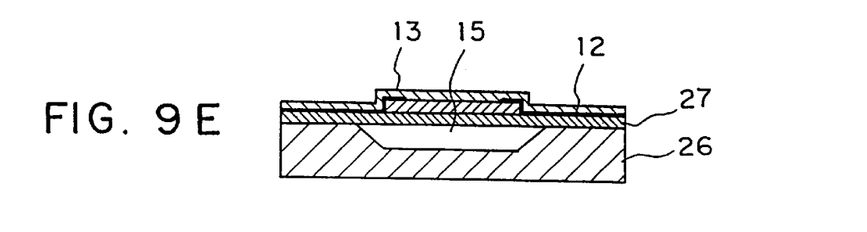
Figure 10:
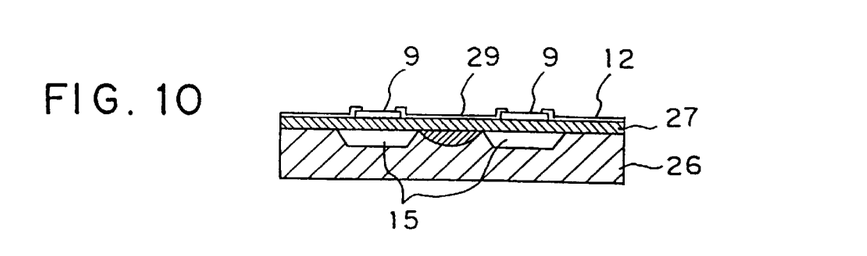
FIG. 10 is a sectional view showing another fabrication process of the IR detector of the fifth embodiment, as shown in FIGS. 9A to 9E

FIG. 10 is a sectional view showing another fabrication process of the IR detector of the fifth embodiment, as shown in FIGS. 9A and 9E. When a plurality of the chains 9 are formed, as shown in FIG. 10, a P+ region 29 which is doped with a high concentration B (Boron) is formed in the chain 9 in the silicon plate 26 in order to separate adjacent hollow sections 15. This P+ region 29 may retard to etch the silicon plate 26 in lateral direction during the fabrication process of the hollow section 15 performed by the etching process.

Because a single crystal of a high crystallinity is used for the semiconductor layers forming the chain 9 in the IR detector and the fabrication method thereof of the embodiment 5, the IR detector having a good Schottky barrier, a highly stable characteristics and a small 1/f noise value can be provided.

Embodiment 6.

FIG. 11 is a sectional view showing an IR detector of the sixth embodiment according to the present invention. In the same diagram, a reference number 3 designates an insulating thin film which is made up of an insulator material such as $SiO_2$, 1 denotes a plurality of semiconductor layers which are made up of semiconductor materials, a poly crystal silicon, an amorphous silicon, and the like, each having an island shape formed on the insulating thin film 3. A reference number 2 indicates a metal thin film which is made up of a material such as TiSi, Ti, Al or AlSi. A reference number 4 designates an insulating material, $SiO_2$ and the like for insulating the semiconductors to each other and for insulating the semiconductor layer 1 from sections other than the bias connection sections 5 and 6 between the semiconductor layer 1 and the metal thin film 2.

A P+ doped region 30 and a N+ doped region 31 are formed in the semiconductor layer 1. The P+ doped region 30 located at the bias connection section 5 side is formed by Boron of the impurity concentration of $10^{19}$ [/cm$^3$] or more. The N+ doped region 31 located at the bias connection section 6 side is formed by Phosphorus (P) of the impurity concentration of $10^{19}$ [/cm$^3$] or more. A P-N junction 32 is formed between the N+ doped region 30 and the P+ doped region 31.

In general, there is an internal voltage potential, which is generated in the formation of the P-N junction, at the P-N junction 32. The magnitude of the internal voltage potential becomes approximately 1 [eV] and it is depended on the levels of the impurity concentrations of the P+ doped region 30 and the N+ doped region 31. Accordingly, the internal voltage potential of the P-N junction 32 can be decreased into a desired value by controlling of the magnitude of bias voltage applied from externally. In addition, the P-N junction 32 is an electric barrier having the same effect of the Schottky barrier at the surfaces of the bias connection sections described in the explanation of the embodiment 1.

Figure 12:
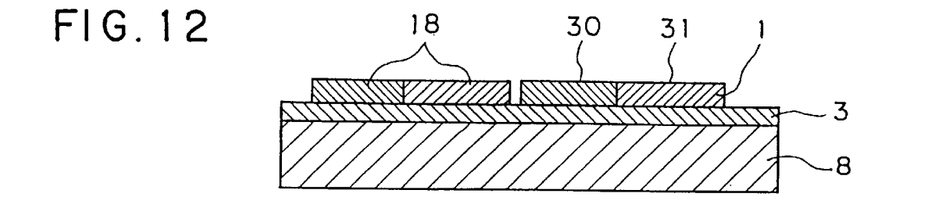
FIG. 12 is a sectional view showing another fabrication process of the IR detector of the sixth embodiment shown in FIG. 11.

FIG. 12 is a sectional view showing another fabrication process of the IR detector of the sixth embodiment, as shown in FIG. 11. In order to form the P-N junction 32, as shown in FIG. 12, a resist film is formed so as to cover the region which will become the N+ doped region 31 and the region which will become the P+ doped region 30 is formed by ion implantation of an impurity such as Boron (B) after the processes shown in FIGS. 3A to 3E. In addition, after eliminating of the resist film, the resist film is formed so as to cover the P+ doped region 30, and the section which will become the N+ doped region 31 is formed by ion implantation of an impurity such as Phosphorus (P). After eliminating the resist film, the IR detector is formed after the processes as shown in FIGS. 3F to 3J.

In the configuration of the IR detector of the embodiment 6, the plurality of semiconductor layers 1 having the P-N junction 32 of the high electric barrier are electrically connected to each other through the metal thin film 2. Thereby, the IR detector having a desired or optimum resistance value can be formed by selecting and adjusting the connection number of the semiconductor layers and the magnitude of bias voltage. In addition, these values described above are selected in order to obtain the maximum electric barrier. Thereby, the impedance matching between the IR detector and a signal readout circuit (not shown) can be performed correctly and the present invention can provide the IR detector having a high sensitivity.

Further, because an impurity of a high concentration is doped into the semiconductor layers 1, the resistance of the semiconductor layers can be decreased and the value of 1/f noise caused by the resistance of the semiconductor layers becomes extremely small.

In addition, in the fabrication processes for the IR detector of the six embodiment, it can be acceptable to use the SOI substrate which has been used in the explanation of the IR detector of the fifth embodiment. By using the SOI substrate, a P-N junction of a high crystallinity can be formed. In this case, the characteristics of the electrical barrier becomes stable, so that the IR detector having a small 1/f noise can be provided. This IR detector can be formed by adding the fabrication processes shown in FIG. 12 into the fabrication process to form the chain 9 shown in FIG. 9B.

Furthermore, in the explanations of the IR detector and the fabrication processes as the embodiments 1 to 6, a poly crystalline silicon or an amorphous silicon is used as the semiconductor layers. However, the present invention is not limited by this. For example, it can be acceptable to use a semiconductor material such as SiC or Ge and the like which forms the electric barrier in the semiconductor layers and which is used in semiconductor fabrication processes.

As described above in detail, in the IR detector of the present invention, a kind of the metal thin film, the connection number N of semiconductor layers and a bias voltage level $V_B$ may be selected so that a desired and suitable resistance value of the IR detector is formed. When these optimum values are selected so that the maximum Schottky barrier Vb' is obtained, optimum impedance matching between the IR detector and a signal readout circuit can be obtained and the sensitivity of the IR detector can be increased.

In addition, in the IR detector of the present invention, the resistances value of semiconductor layers can be decreased without changing the value of TCR by increasing the areas of bias connection sections. Moreover, the resistance value can be decreased and the level of Schottky barrier can be increased in proportion to the decreasing of the resistance value without changing the total resistance value of IR detector, and the value of TCR can be increased. Thereby, optimum impedance matching between the IR detector and a signal readout circuit can be obtained and the sensitivity of the IR detector can be increased.

Furthermore, in the IR detector of the present invention, optimum lengths of semiconductor layers can be selected in thickness direction and longitudinal direction so that the value of TCR become large and the size of the IR detector becomes small. Moreover, the configuration of the IR detector becomes simple and the number of fabrication processes can be decreased.

In addition, in the IR detector of the present invention, because a P-N conjunction operates an electric barrier, like a Schottky barrier, the value of TCR becomes large and the P+ and N+ regions are doped with a high impurity concentration, bias connection sections become an ohmic connection and the resistance values of the P+ region and the N+ region become low resistance values. Thereby, the noise of 1/f caused by the resistances of semiconductor layers can be decreased and it can be easily obtained to match the impedance matching between the IR detector and a signal readout circuit and the value of TCR becomes large, so that IR detector of the present invention can have a high performance.

Further, in the IR detector of the present invention, because a semiconductor layer comprising a single crystal layer of a good crystallization formed on a SOI substrate is used, a stable Schottky barrier or P-N junction can be obtained, so that IR detector can have a stable characteristics and a very small 1/f noise.

In addition, in the IR detector of the present invention, because a high impurity concentration region is formed in a semiconductor layer, the resistance of the semiconductor layer can be decreased in proportion to the decreasing of the resistance of the semiconductor layer and the resistance of a Schottky barrier can be increased. Thereby, the value of TCR can be increased without changing of the total resistance value of the IR detector. Moreover, the value of 1/f noise caused by the resistance of the semiconductor layer can be decreased.

Further, in the IR detector of the present invention, although there is a possibility that the resistance value of a backward bias connection section becomes high, because a high impurity concentration region is formed at the backward bias connection section, the resistance of the semiconductor layer can be decreased and the backward bias connection section becomes an ohmic connection. Thereby, the value of TCR can be increased without changing the total resistance value and the value of 1/f caused by the resistance of the semiconductor layer can also be decreased.

In addition, in the IR detector of the present invention, because the lengths of a thickness direction and a longitudinal direction of a semiconductor layer are selected suitably so that the area of Schottky barrier becomes large, the value of TCR can be increased and the size of the IR detector can also be small. Thereby, the configuration of the IR detector can be simple and the number of fabrication processes and fabrication time period can be decreased.

In addition, in the fabrication method of the present invention, because a SOI substrate having a good crystallization is used, the IR detector having a stable Schottky barrier and a stable characteristic can be fabricated. A plurality of semiconductor layers are formed with a material of a good crystallization, so that the IR detector having a low 1/f noise value can be fabricated. Further, the number of the fabrication processes can be decreased.

Furthermore, in the fabrication method of the present invention, because an impurity is doped into a plurality of semiconductor layers so that an impurity concentration of a section in the semiconductor layer between surfaces is higher than that of a section in the semiconductor layer near to a metal thin film, the semiconductor layer having a low resistance value, the resistance of Schottky barrier increased in proportion to the decreasing of the resistance of the semiconductor layer, and a large TCR value can be formed. Thereby, the IR detector having a high performance can be fabricated.

In addition, in the fabrication method of the present invention, because an impurity concentration of a plurality of semiconductor layers at one surface region is formed to be higher than that of the plurality of semiconductor layers near to the other surface region, a backward bias connection section where there is a possibility to become a high resistance section can be formed as an ohmic resistance area. Thereby, the IR detector in which the resistance of the semiconductor layer is decreased, the value of TCR is increased without changing of the total resistance value and the value of 1/f noise caused by the resistance of the semiconductor layer becomes low can be formed.

Although the present invention has been described and illustrated in detail, it is clearly understood that the same is by way of illustration and example only and is not to be taken by way of limitation, the spirit and scope of the present invention being limited only by the term of the appended claims.

What is claimed is:

1. An infrared (IR) detector comprising:
    an insulating thin film made up of an insulating material;
    a plurality of semiconductor layers formed directly on the insulating thin film;
    a forward bias connection section and a backward bias connection section formed for each of the plurality of semiconductor layers to be a forward bias and a backward bias to an external bias voltage; and
    a metal thin film for electrically connecting the plurality of semiconductor layers to each other through the forward bias connection section and the backward bias connection section.

2. An IR detector as claimed in claim 1, wherein each of the plurality of semiconductor layers has an island shape and both the forward bias connection section and the backward bias connection section are formed on the plurality of semiconductor layers.

3. An IR detector as claimed in claim 1, wherein the forward bias connection section and the backward bias connection section are formed so that the metal thin film is buried between the plurality of semiconductor layers.

4. An IR detector as claimed in claim 1, wherein a P-N junction is formed in each of the plurality of semiconductor layers by forming a P+ region and an N+ region in each of the plurality of semiconductor layers, said P+ region being adjacent to one of the forward bias connection section and the backward bias connection section, said N+ region being adjacent to the other of the forward bias connection section and the backward bias connection section, said forward bias connection section and said backward bias connection section forming ohmic contacts.

5. An IR detector as claimed in claim 2, wherein a P-N junction is formed in each of the plurality of semiconductor layers by forming a P+ region and an N+ region in each of the plurality of semiconductor layers, said P+ region being adjacent to one of the forward bias connection section and the backward bias connection section, said N+ region being adjacent to the other of the forward bias connection section and the backward bias connection section, said forward bias connection section and said backward bias connection section forming ohmic contacts.

6. An IR detector as claimed in claim 3, wherein a P-N junction is formed in each of the plurality of semiconductor layers by forming a P+ region and an N+ region in each of the plurality of semiconductor layers, said P+ region being adjacent to one of the forward bias connection section and the backward bias connection section, said N+ region being adjacent to the other of the forward bias connection section and the backward bias connection section, said forward bias connection section and said backward bias connection section forming ohmic contacts.

7. An IR detector as claimed in claim 1, wherein each of the forward bias connection section and the backward bias connection section is a Schottky barrier.

8. An IR detector as claimed in claim 2, wherein each of the forward bias connection section and the backward bias connection section is a Schottky barrier.

9. An IR detector as claimed in claim 3, wherein each of the forward bias connection section and the backward bias connection section is a Schottky barrier.

10. An IR detector as claimed in claim 1, wherein the plurality of semiconductor layers are formed as a silicon on insulator (SOI) substrate.

11. An IR detector as claimed in claim 3, wherein the plurality of semiconductor layers are formed as a silicon on insulator (SOI) substrate.

12. An IR detector as claimed in claim 5, wherein the plurality of semiconductor layers are formed as a silicon on insulator (SOI) substrate.

13. An IR detector as claimed in claim 1, wherein an impurity concentration of the semiconductor layer section between the forward bias connection section and the backward bias connection section is greater than an impurity concentration of semiconductor layer sections near to both the forward bias connection section and the backward bias connection section.

14. An IR detector as claimed in claim 2, wherein an impurity concentration of the semiconductor layer section between the forward bias connection section and the backward bias connection section is greater than an impurity concentration of semiconductor layer sections near to both the forward bias connection section and the backward bias connection section.

15. An IR detector as claimed in claim 3, wherein an impurity concentration of the semiconductor layer section between the forward bias connection section and the backward bias connection section is greater than an impurity concentration of semiconductor layer sections near to both the forward bias connection section and the backward bias connection section.

16. An IR detector as claimed in claim 1, wherein an impurity concentration of the semiconductor layer at the backward bias connection section side is higher than an impurity concentration of the semiconductor layer near to the forward bias connection section.

* * * * *